US008835986B2

(12) United States Patent
Srivastava et al.

(10) Patent No.: US 8,835,986 B2
(45) Date of Patent: Sep. 16, 2014

(54) METHOD FOR FABRICATION OF III-NITRIDE DEVICE AND THE III-NITRIDE DEVICE THEREOF

(75) Inventors: Puneet Srivastava, Leuven (BE); Marleen Van Hove, Leuven (BE); Pawel Malinowski, Leuven (BE)

(73) Assignees: IMEC, Leuven (BE); Katholieke Universitiet Leuven, K.U. LEUVEN R&D, Leuven (BE)

( * ) Notice: Subject to any disclaimer, the term of this patent is extended or adjusted under 35 U.S.C. 154(b) by 0 days.

(21) Appl. No.: 13/526,747

(22) Filed: Jun. 19, 2012

(65) Prior Publication Data

US 2012/0326215 A1   Dec. 27, 2012

Related U.S. Application Data

(60) Provisional application No. 61/499,981, filed on Jun. 22, 2011.

(51) Int. Cl.
*H01L 29/778* (2006.01)
*H01L 29/06* (2006.01)
*H01L 23/36* (2006.01)
*H01L 29/20* (2006.01)

(52) U.S. Cl.
CPC ........ *H01L 29/7783* (2013.01); *H01L 29/0657* (2013.01); *H01L 23/36* (2013.01); *H01L 29/2003* (2013.01)
USPC .................................. 257/194; 257/E29.249

(58) Field of Classification Search
CPC ............ H01L 29/0649; H01L 29/0653; H01L 29/778; H01L 29/7783; H01L 28/7783
USPC .................. 257/192, 194, E29.246–E29.249
See application file for complete search history.

(56) References Cited

U.S. PATENT DOCUMENTS

| 2007/0051977 A1 | 3/2007 | Saito et al. |
| 2010/0065923 A1 | 3/2010 | Charles et al. |
| 2011/0101370 A1* | 5/2011 | Cheng et al. .................... 257/76 |

FOREIGN PATENT DOCUMENTS

JP          2010-67662 A     3/2010

OTHER PUBLICATIONS

Srivastava et al. "Silicon Substrate Removal of GaN DHFETs for Enhanced (>1100 V) Breakdown Voltage" IEEE Electron Device Letters, vol. 31, No. 8, Aug. 2010, 851-853.
Srivastava et al. "Record Breakdown Voltage (2200 V) of GaN DHFETs on Si With 2-μm Buffer Thickness by Local Substrate Removal" IEEE Electron Device Letters, vol. 32, No. 1, Jan. 2011, 30-32.

* cited by examiner

*Primary Examiner* — Yu Chen
(74) *Attorney, Agent, or Firm* — Knobbe Martens Olson & Bear, LLP.

(57) ABSTRACT

A III-nitride device is provided comprising a semiconductor substrate; a stack of active layers on the substrate, each layer comprising a III-nitride material; a gate, a source and a drain contact on the stack, wherein a gate, a source and a drain region of the substrate are projections of respectively the gate, the source and the drain contact in the substrate; and a trench in the substrate extending from a backside of the substrate (side opposite to the one in contact with the stack of active layers) to an underlayer of the stack of active layers in contact with the substrate, the trench completely surrounding the drain region, being positioned in between an edge of the gate region towards the drain and an edge of the drain region towards the gate and having a width such that the drain region of the substrate is substantially made of the semiconductor material.

12 Claims, 12 Drawing Sheets

METHOD FOR FABRICATION OF III-NITRIDE DEVICE AND THE III-NITRIDE DEVICE THEREOF

CROSS-REFERENCE TO RELATED APPLICATIONS

This application claims the benefit under 35 U.S.C. §119 (e) of U.S. provisional application Ser. No. 61/499,981 filed on Jun. 22, 2011, the disclosure of which is hereby expressly incorporated by reference in its entirety and is hereby expressly made a portion of this application.

FIELD OF THE DISCLOSURE

Semiconductor devices and methods for manufacturing the same are provided. More particularly, a method for manufacturing a III-nitride device and the III-nitride device thereof are provided.

BACKGROUND OF THE DISCLOSURE

GaN-based materials have excellent properties for application in power transistors for low loss and high power switching. The AlGaN/GaN/AlGaN double-heterostructure FETs (DHFETs) configuration is extremely promising for high power applications due to the improved carrier confinement.

These devices offer lower on-resistance $R_{ON}$ (due to the formation of 2-DEG in un-doped GaN-channel) and high breakdown voltage due to AlGaN buffer. Among the substrates (Si, SiC, sapphire), Si is the most suitable choice for epitaxial growth due to its comparable thermal conductivity to GaN system, low cost and large size availability. However, devices fabricated on Si have the disadvantage that the maximum breakdown voltage ($V_{BD}$) is limited by the Si substrate itself due to its lower critical electrical field strength (0.3 MV/cm) compared to Al(GaN) materials. This leads to an unwanted leakage path across the AlN/Si inversion interface and therefore $V_{BD}$ is limited by the thickness of the buffer.

SUMMARY OF THE DISCLOSURE

It is an aim of the present disclosure is to provide a III-nitride device having a breakdown voltage enhancement with respect to the state of the art. Another aim is to provide a method for manufacturing a III-nitride device having a breakdown voltage enhancement with respect to the state of the art.

The disclosure provides a III-nitride device comprising: a) a substrate made of a semiconductor material; b) a stack of active layers on top of and in contact with the substrate, each of said active layers comprising a III-nitride material, an active-layer-stack/substrate interface being defined as the transition between the stack and the substrate; c) a gate contact, a source contact and a drain contact on the stack of active layers, wherein a gate region, a source region and a drain region of the substrate are projections of respectively the gate contact, the source contact and the drain contact in the substrate; and d) a trench in the substrate extending from a backside of the substrate, said backside being opposite to the side of the substrate that is in contact with the stack of active layers, through the substrate up to an underlayer of the stack of active layers, the trench, preferably completely, surrounding the drain region, such that the drain region is electrically isolated from the gate and source regions across the active-layer-stack/substrate interface, and being positioned in between an edge of the gate region towards the drain region or positioned away from the drain region, and an edge of the drain region towards the gate region or positioned away from the gate region, and/or having a width such that the drain region of the substrate is substantially made of the semiconductor material. Thus, the trench may, optionally, be positioned in between an edge of the gate region and an edge of the drain region.

Such a device can have a lower leakage at elevated voltage compared to the devices without said trench. This is because an additional parallel conduction path along the active-layer-stack/substrate interface, which may for example be an AlN/Si interface, may be substantially eliminated and therefore a device with a relatively high blocking voltage may be achieved.

In an embodiment, the trench is filled with an electrically insulating and thermally conductive material.

In an embodiment, the device further comprises a first protective layer on the backside of the substrate, the first protective layer comprising an electrically insulating and thermally conductive material.

In an embodiment, the device further comprises a second protective layer overlying and in contact with the source, gate and drain contacts, the second protective layer comprising an electrically insulating and thermally conductive material.

In an embodiment, the trench has a width greater than or equal to the thickness of the stack of active layers and smaller than or equal to the distance between the edge of the gate region towards the drain and the edge of the drain region.

In an embodiment, the electrically insulating and thermally conductive material is selected from the group consisting of AlN, SiC, diamond, BN and combinations thereof.

In an embodiment, the electrically insulating and thermally conductive material is AlN.

In an embodiment, the substrate is a thinned silicon wafer.

The disclosure also provides a method for manufacturing a III-nitride device comprising: a) providing a substrate made of a semiconductor material; b) forming a stack of active layers on the substrate, each of said active layers comprising a III-nitride material, an active-layer-stack/substrate interface being defined as the transition between the stack and the substrate; c) forming a source contact, a gate contact and a drain contact on the stack of active layers, wherein a gate region, a source region and a drain region of the substrate are projections of respectively the gate contact, the source contact and the drain contact in the substrate; and d) forming a trench in the substrate extending from a backside of the substrate, said backside being opposite to the side of the substrate that is in contact with the stack of active layers, through the substrate up to an underlayer of the stack of active layers in contact with the substrate, the trench, preferably completely, surrounding the drain region such that the drain region is electrically isolated from the gate and source regions across the active-layer-stack/substrate interface, being positioned in between an edge of the gate region towards the drain or positioned away from the drain, and an edge of the drain region, and/or having a width such that the drain region of the substrate is substantially made of the semiconductor material. Thus, the trench may, optionally, be positioned in between an edge of the gate region and an edge of the drain region.

In an embodiment, the method further comprises filling the trench with an electrically insulating and thermally conductive material.

In an embodiment, the method further comprises depositing a first protective layer on the backside of the substrate, the first protective layer comprising an electrically insulating and thermally conductive material.

In an embodiment, the first protective layer functions as mask layer for forming the trench.

In an embodiment, the method further comprises depositing a second protective layer overlying and in contact with the source, gate and drain contacts, the second protective layer comprising an electrically insulating and thermally conductive material.

In an embodiment, the trench has a width higher or equal with the thickness of the stack of active layers and lower or equal to the distance between the edge of the gate region towards the drain and the edge of the drain region.

In an embodiment, the electrically insulating and thermally conductive material is selected from the group consisting of AlN, SiC, diamond, BN and combinations thereof.

In an embodiment, the electrically insulating and thermally conductive material is AlN.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

The aim of the present disclosure is to provide a III-nitride device having a breakdown voltage enhancement with respect to the state of the art. It is another aim of the disclosure to provide III-nitride devices with improved thermal performance with respect to the state of the art. It is yet another aim of the disclosure to provide III-nitride devices with improved mechanical performance with respect to the state of the art.

Another aim is to provide a method for manufacturing a III-nitride device having a breakdown voltage enhancement with respect to the state of the art.

Group III-nitride devices, such as e.g. high electron mobility transistors (HEMTs), comprise a two-dimensional electron gas (2-DEG) between two active layers, e.g. between a GaN layer and an AlGaN layer. This 2-DEG layer is a result of piezoelectric and spontaneous polarization leading to charge separation within the materials. In known devices of this type, the 2-DEG is present at zero gate bias due to the characteristics of the materials. GaN field effect transistor devices (FETs) with contacts formed on top of an AlGaN layer are normally-on devices. The formation of contacts on the AlGaN layer does not change the charge polarization in the heterostructure such that, if there was a 2-DEG present before processing, it would remain there after formation of contacts on top of the AlGaN layer. A certain negative voltage, called threshold voltage, on the gate is required to deplete the 2-DEG through capacitive coupling. By applying a negative voltage to the gate, the electron channel can be pinched off. This negative voltage is typically below a negative threshold voltage (Vth), typically between −4 V and −8 V. These transistors work in depletion-mode (D-mode) which means that the channel has to be depleted to switch off the transistor.

For certain applications, such as e.g. power switching or integrated logic, a negative-polarity gate voltage supply is not wanted; the gate control of power devices in e.g. power supplies should be made similar to that used for Si devices. Field-effect transistors (FET) with a threshold voltage Vth=0 V are normally-off devices. At zero gate voltage, no channel is present to conduct current. These transistors work in enhancement-mode (E-mode). E-mode transistors are attractive for normally-off power switches, for digital electronics applications, and for high efficiency RF applications.

In the E-Mode configuration, a metal insulator semiconductor high electron mobility transistor (MISHEMT) is preferred because of the possibility to overdrive the gate in the forward direction which enables to benefit from the full sheet carrier density. In the case of MISHEMTs, gate dielectrics have been used comprising $SiO_2$, $Si_3N_4$ and other oxides with high dielectric constant such as $Al_2O_3$, $HfO_2$ or $Sc_2O_3$ (high k dielectrics). However, in all cases, the interface between the semiconductor and the deposited oxide is difficult to control which prevent to benefit from the full potentiality of the MISHEMT configuration.

In the present disclosure, the term 'III-nitride' denotes a semiconductor material that comprises at least one element from Group III of the Periodic Table of Elements and nitrogen. Examples of III-nitride compound semiconductors that can be used in the present disclosure include, but are not limited to GaN, AlN, InGaN, InAlN, AlGaN, mixtures and combinations thereof.

Throughout this disclosure, the term 'band gap' refers to the energy difference between the top of the valence band and the bottom of the conduction band. In general, a wide band gap (WBG) semiconductor is a semiconductor material with an electronic band gap larger than 1 eV and, preferably, larger than 2 eV. In general, a narrow band gap (NBG) semiconductor is a semiconductor material with an electronic band gap smaller than 1 eV and, preferably, smaller than 0.6 eV. However, the absolute ranges described above are only informative, since throughout this disclosure, it is rather the relative difference between the WBG and NBG that will determine the good working of the device, than the actual absolute value of the band gap.

The method and the III-nitride device of the disclosure is applicable for GaN based transistors fabricated on substrates made of doped semiconductor substrates (Si) and is suitable to DHFET, SHFET (single hetero-structure FETs) or Schottky barrier diode (SBD) devices. It is suitable for both GaN based enhancement mode (E-mode) transistor or depletion mode (D-mode) transistors. Various kinds of device architectures, such as Schottky gate HEMTs, MISHEMTs or MOSHEMTs are compatible with the method of the disclosure. Moreover, the method of the disclosure can reduce the substrate related losses and output capacitances leading to improved PAE (power added efficiency) for RF-based devices.

A first aspect of the present application discloses a III-nitride device comprising
 a) a substrate made of a semiconductor material,
 b) a stack of active layers on the substrate, each of said active layers comprising a III-nitride material, an active-layer-stack/substrate interface being defined as the transition between the stack and the substrate;
 c) a gate contact, a source contact and a drain contact on the stack of active layers, wherein a gate region, a source region and a drain region of the substrate are projections of respectively the gate contact, the source contact and the drain contact in the substrate
 d) a trench in the substrate extending from a backside of the substrate up to an underlayer of the stack of active layers, i.e. the underlayer being exposed towards the backside, the trench, preferably completely, surrounding the drain region, at least such that the drain region is electrically isolated from the gate and source regions across the active-layer-stack/substrate interface, and being positioned in between an edge of the gate region towards the drain region and an edge of the drain region towards the gate region and having a width such that the drain region of the substrate is substantially made of the semiconductor material.

The backside of the substrate is the side opposite to the one in contact with the stack of active layers.

According to embodiments of both aspects of the disclosure the trench has an aspect ratio (depth/width) between 10 and 500, preferably between 10 and 50.

The trench width is higher or equal to the thickness of the stack of active layers and lower or equal to the distance between the edge of the gate region towards the drain and the edge of the drain region towards the gate ($L_{GD}$). In specific embodiments the trench width is between 2 μm to 25 μm, preferably between 2 μm to 20 μm, more preferably between 2 μm to 10 μm.

The trench is, preferably completely, surrounding the drain region of the substrate. Preferably the trench is adjacent with the drain region of the substrate. An overlapping of the trench with the drain region of the substrate is preferably limited to about 10% of the volume of the drain region of the substrate. This means that upon trench definition the drain region of the substrate preferably substantially (90% or more) consists of the semiconductor material of the substrate. Thus, the drain region of the substrate may be substantially made of the semiconductor material. It may be clear that, by having the width of the trench arranged thereto, it can be achieved that the drain region of the substrate is substantially made of the semiconductor material. Further, even if there is a relatively small, e.g. about 10%, overlapping of the trench with the volume of the drain region of the substrate, the trench may be considered to be positioned in between an edge of the drain region towards the gate, i.e. positioned towards the gate, and, preferably, an edge of the gate region towards the drain, i.e. positioned towards the drain. Alternatively, or additionally, even if there is a relatively small, e.g. about 10%, overlapping of the trench with a volume of a gate region of the substrate, the trench may be considered to be positioned in between an edge of the drain region towards the gate and, preferably, an edge of the gate region towards the drain. Thus, a width of the trench may be arranged such that a gate region of the substrate is substantially made of the semiconductor material. The silicon substrate may be present under at least part of the gate. Since the semiconductor material of the substrate (e.g. silicon) has a good thermal conductivity, the thermal dissipation under the drain is kept while at the same time having the benefit of the high aspect ratio trench in the substrate according to the method of the disclosure.

A substantial reduction in channel temperature is obtained for a trench adjacent with the drain region of the substrate, having a maximum overlap of 10% with the drain region of the substrate and having a trench width at the lower end of the above mentioned range.

In embodiments of the disclosure the trench is filled with an electrically insulating and thermally conductive material.

In the context of the present disclosure an electrically insulating and thermally conductive material is a material having a breakdown voltage higher than the breakdown voltage of GaN and a thermal conductivity comparable or better than that of silicon. More preferably, an electrically insulating and thermally conductive material is a material having a breakdown voltage higher or equal to 10 MV/cm and a thermal conductivity equal or higher than 140-150 W/m.K.

In the context of the present disclosure the breakdown voltage is defined as the voltage for a certain leakage spec, i.e. a leakage current of 1 mA/mm.

In embodiments of the disclosure the device comprises further a first protective layer on the backside of the substrate, the first protective layer comprising an electrically insulating and thermally conductive material.

Furthermore, the device can comprise further a second protective layer overlying and in contact with the source, gate and drain contacts, the second protective layer comprising an electrically insulating and thermally conductive material.

Preferably, the first protective layer and the second protective layer are made of an electrically insulating and thermally conductive material complying with the definition above.

In embodiments of the disclosure, the electrically insulating and thermally conductive material is selected from the group consisting of AlN, SiC, BN, diamond and combinations thereof.

More preferably, the electrically insulating and thermally conductive material is made of AlN.

In embodiments of the disclosure, the trench has a width (w) higher or equal with the thickness of the stack of active layers and lower or equal to the distance between the edge of the gate region towards the drain and the edge of the drain region towards the gate ($L_{GD}$).

In embodiments of the disclosure, the substrate comprises a semiconductor material having a narrow band gap. Preferably the substrate is made of n- or p-type doped silicon, germanium, doped GaAs. More preferably the substrate is a thinned silicon wafer. A thinned silicon wafer is a silicon wafer which has been thinned from an initial thickness of e.g. 500 µm-1500 µm (for a 200 mm wafer) to a thickness of 100-125 µm.

In embodiments of the disclosure, a stack of active layers comprising III-nitride is formed by epitaxial techniques on the substrate. The stack of active layers comprises in general a buffer layer, a channel layer and a barrier layer. Alternatively, the channel layer can be the upper part (top) of a thick buffer layer. Each of the active layers can be a multi-layer or a layer having a graded composition.

A conventional HEMT, e.g. an AlGaAs/GaAs HEMT, uses an undoped relatively low-bandgap material for the channel layer (for example GaAs), which is supplied with electrons by a doping layer located between the channel and the gate contact in a barrier layer made of a relatively higher bandgap material (for example AlGaAs). By combining materials with different bandgaps, i.e. a material with a higher bandgap and a material with a lower bandgap, a quantum well may be formed at the interface between the combined materials. The separation of the channel dopant layer, where electron scattering is high, from the channel itself significantly increases the mobility of the electrons in the channel. It is the high mobility of the carriers that provides the fundamental advantage of HEMT technology over conventional MESFET devices in high frequency operation. In the more particular case of an AlGaN/GaN HEMT, the higher bandgap material, in the example given AlGaN, is undoped and a high sheet carrier concentration in the quantum channel is obtained by piezoelectric and spontaneous polarization induced effects.

In the context of the present disclosure the thickness of the buffer layer may, for example, be between 200 nm and 10 µm, preferably between 1 µm and 3 µm. Optionally, additional buffer layers, e.g. nucleation layers and/or interlayers such as e.g. AlGaN, AlN or GaN interlayers, may be provided to overcome the thermal expansion and lattice mismatch between the substrate and the active layers.

Next, the channel layer may comprise GaN, GaAs or InGaAs. The thickness of the channel layer may, for example, be between 5 nm and 200 nm, preferably between 50 nm and 200 nm. Next, the barrier layer may, for example, comprise AlGaN, AlGaAs or InAlAs. The thickness of the barrier layer may, for example, be between 1 and 50 nm, preferably between 5 nm and 30 nm. Alternatively, AlGaAs/GaAs transistor can be fabricated, without an explicit channel layer. Additionally, a cap layer comprising a III-nitride material can be formed by epitaxial growth on the barrier layer. Such additional cap layer may comprise GaN and have a thickness between 1 nm and 10 nm.

In general, a passivation layer comprising silicon nitride may be grown in-situ such that it is overlying and in contact with an upper layer of the stack of active layers. The upper layer can be the barrier layer or the additional cap layer or any other III-nitride layer part of the stack of III-nitride layers used to form the HEMT.

In a second aspect of the application a method for manufacturing a III-nitride device is disclosed comprising:

a) providing a substrate made of a semiconductor material, b) forming a stack of active layers on the substrate, each of the active layers comprising a III-nitride material, c) forming a source contact, a gate contact and a drain contact on the stack of active layers, wherein a gate region, a source region and a drain region of the substrate are projections of respectively the gate, the source and the drain contact in the substrate, d) forming a trench in the substrate extending from a backside of the substrate (opposite to the side of substrate in contact with the stack of active layers) up to an underlayer of the stack of active layers, the trench, preferably completely, surrounding the drain region, at least such that the drain region is electrically isolated from the gate and source regions, and being positioned in between an edge of the gate region towards the drain region and an edge of the drain region towards the gate region and having a width such that the drain region of the substrate is substantially made of the semiconductor material. If the drain region is electrically isolated from the gate and source regions across the active-layer-stack/substrate interface it means that the drain contact is isolated from the gate and source contacts across the active-layer-stack/substrate interface.

According to embodiments of the disclosure, forming the trench in the substrate comprises depositing a mask layer, forming a pattern in the mask layer and etching the substrate selectively with respect the mask layer.

According to embodiments of the disclosure, the method further comprises depositing a first protective layer on the backside of the substrate, the first protective layer comprising an electrically insulating and thermally conductive material.

It is an advantage of the method of the disclosure that the first protective layer can function as a mask layer for etching the trench in the substrate.

Examples of an electrically insulating and thermally conductive material which are suitable to be used as both as first (backside) protective layer and as mask layer are: AlN, SiC, BN and diamond. More preferably, the first protective layer is made of AlN.

According to various embodiments of the disclosure the first protective layer serves as mask layer for forming the trench.

In the embodiments wherein the substrate is made of silicon and the mask layer (first protective layer) is made of AlN, a F-based dry-etch process or a wet etch process can be used to etch the trench. In a particular example, an etch chemistry comprising $SF_6/C_4F_8$ is used to etch the trench, since this chemistry is very selective to AlN layers. Without wishing to be bound by theory it is believed that when AlN is exposed to an etch chemistry comprising $SF_6/C_4F_8$, $AlF_3$ is formed which functions as an etch stop layer preventing thereby any over-etch.

The stack of active layers of the III-nitride device can be fabricated by metal-organic chemical vapor deposition (MOCVD) or by molecular beam epitaxy (MBE), in which the device layers are built up by deposition of molecules in a vacuum.

The active layers growth typically starts with a buffer layer to achieve a high quality device. In case the substrate material is different from the active material, this buffer layer also accommodates the difference in lattice constant.

According to embodiments of the disclosure the underlayer of the stack of active layers which is in contact with the substrate is made of AlN (also referred to as nucleation layer). Advantageously, this nucleation layer functions as an etch stop layer at the bottom of the trench preventing any over-etch. Consequently the method of the disclosure leaves the stress in the channel layer unchanged and the 2-DEG properties remain unaltered.

According to embodiments of the disclosure, the trench is filled with an electrically insulating and thermally conductive material. This material is deposited by plasma enhanced chemical vapor deposition (PECVD), metal organic chemical vapor deposition (MOCVD), low pressure chemical vapor deposition (LPCVD) or an equivalent technique.

Embodiments of the disclosure describe depositing a second protective layer overlying and in contact with the source, gate and drain contacts, the second protective layer comprising an electrically insulating and thermally conductive material. Preferably the second protective layer is deposited first, followed by substrate flip and deposition of the first protective layer.

Figure 1:
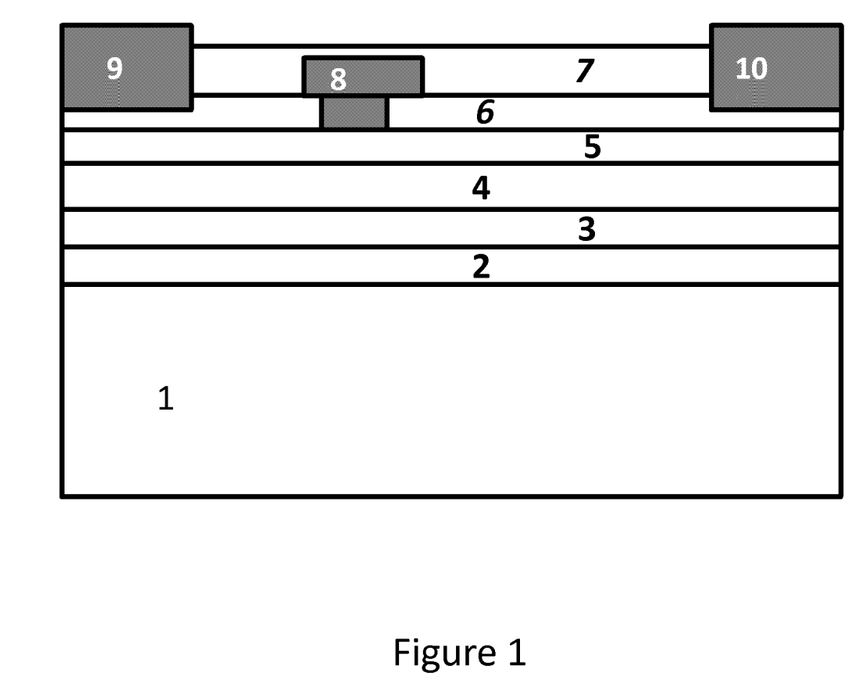
FIG. 1 shows the schematic cross-sectional view of DHFET device.

FIG. 1 shows the schematic cross-sectional view of a DHFET device with source, gate, drain contacts and active layers fabricated on Si substrate, wherein: reference number 1 refers to a substrate, Si (111); reference number 2 refers to an AlN nucleation layer; reference number 3 refers to an $Al_yGa_{1-y}N$ (0.05<y<0.8) buffer layer; reference number 4 refers to a GaN channel layer; reference number 5 refers to an $Al_xGa_{1-x}N$ (0.1<x<0.5) barrier layer; reference number 6 refers to an in-situ $Si_3N_4$ layer; reference number 7 refers to an ex-situ passivation layer; reference number 8 refers to a gate; reference number 9 refers to a source; and reference number 10 refers to a drain. Similar reference numbers are used in FIGS. 2, 3, and 7-11.

Figure 2:
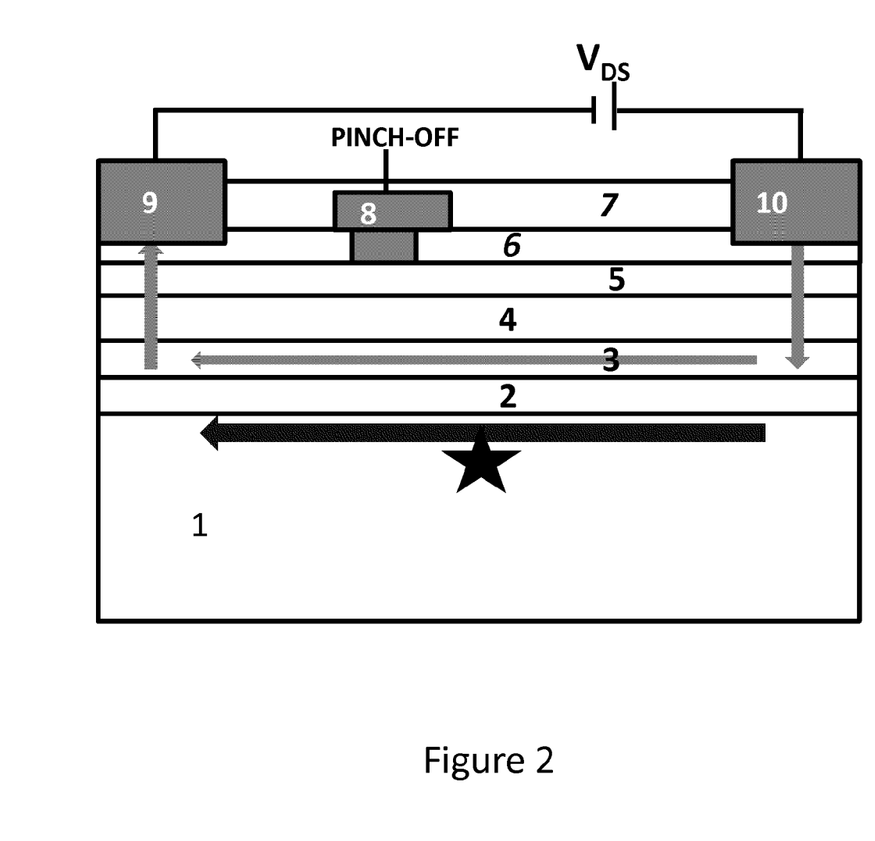
FIG. 2 illustrates schematically the mechanism of the premature device breakdown of a DHFET device on Si substrate.

FIG. 2 illustrates schematically the mechanism of the premature device breakdown of a DHFET device on Si substrate at elevated applied voltage due to an electrical conduction across the parasitic channel via inversion layer across the AlN/Si interface (marked with star).

This mechanism limits the maximum breakdown voltage, which saturates at a certain value for a given buffer thickness (e.g. 700V for an AlGaN buffer having a thickness of 2 μm) and is independent of gate-drain distance. State of the art uses thicker buffer (GaN or AlGaN) to postpone the parasitic conduction mechanism to higher voltage values, however the devices still show premature breakdown. Moreover, the use of thick buffers makes the stress control in the epi-grown III-nitride layers on Si more difficult which may lead to an increased wafer bow, crack formation, defects creation or even wafer breakage. Therefore thicker buffers hinder the scalability of the epi-grown layers over large sized Si substrates. The large sized Si substrate refer to Si wafers having a diameter of 150 mm, 200 mm, 300 mm or larger.

Figure 3:
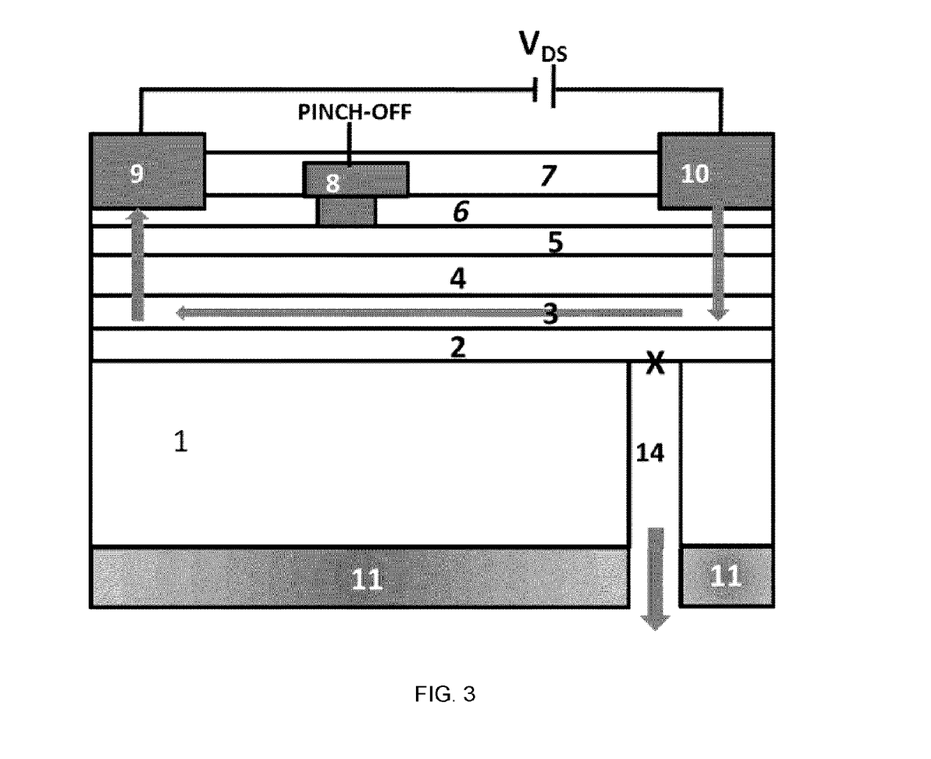
FIG. 3 illustrates schematically a device of the disclosure, with an interruption ("X") in the leakage path across the AlN/Si interface.

The device of the disclosure relies on electrically isolating drain-contact from source- or gate-contact by interrupting the leakage path across the AlN/Si interface as indicated by "X" in FIG. 3, leading to a low leakage at high voltage, thus a higher breakdown voltage.

One advantage of the device of the disclosure is that the Si substrate is still present under the gate, extending towards the drain, thereby reducing further the electric field peak under the gate-edge towards the drain side. Moreover, the remaining Si substrate assists in dissipating heat (functions as a heatsink) during the ON-state device operation.

In specific embodiments (e.g. GaN DHFET based power bars), multiple long (up to 10 mm) and narrow trenches according to the disclosure can further allow to dissipate heat through numerous Si "legs" (remaining Si substrate) functioning as a heat sink, thereby enhancing the overall thermal stability. The remaining Si under the gate, source and drain contacts strengthens the mechanical support e.g. during wire bonding and packaging.

In specific embodiments the Si substrate is first thinned by grinding or by plasma etch (e.g. $SF_6$-based) or by chemical etch to about 100 μm, followed by backside hard mask layer (protective layer) deposition (e.g. AlN) and patterning of the trenches surrounding the drain regions using the backside hard mask.

In specific embodiments reactive ion etch (RIE) with F-based chemistry (e.g. $SF_6/C_4F_8$ chemistry) is used to fabricate the narrow trenches around the drain region as illustrated in FIG. 3. AlN backside hard mask (protective layer) and AlN nucleation layer at the bottom of the trenches act both as etch stop layer for F-based Si etching with very high selectivity due to the formation of $AlF_3$. Therefore, a high aspect ratio trench 14 is fabricated without damaging the AlN nucleation layer. The high selectivity leads also to an unchanged stress in the device layers and therefore channel properties remain unchanged.

The trenches can be formed immediately after the epitaxial growth of the (III-nitride) active layers stack. Alternatively, the trenches can be formed after the source, drain, gate contacts definition. Optionally in this later case a second protective layer (e.g. AlN) is formed on the front side of the wafer, overlying and in contact with the source, gate and drain contacts.

The trench width can be as small as the III-nitride stack thickness. Advantageously the device and the method of the disclosure allow further scalability of the buffer stack (III-nitride layers stack).

The device of the disclosure has lower leakage at elevated voltage compared to the devices without said trench. This is because an additional parallel conduction path along AlN/Si interface is eliminated and therefore high blocking voltage devices can be achieved.

Figure 4:
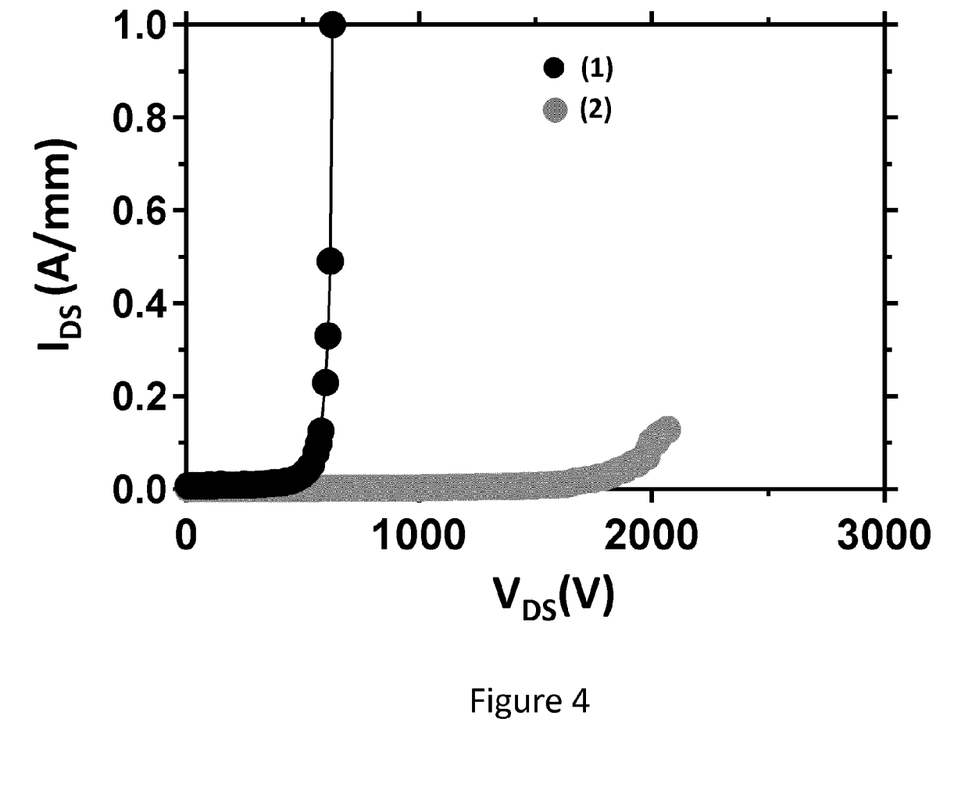
FIG. 4 shows the breakdown measurement curves for a DHFET device (1) and the device of the disclosure (2) both having gate-drain distance ($L_{GD}$) of 20 μm.

FIG. 4 shows a device according to embodiments of the disclosure with trench width of 14 μm, adjacent to the drain region of the substrate, which has a breakdown voltage of more than 2 kV with gate-drain distance ($L_{GD}$) of 20 μm, versus a device on a full Si substrate (without trench) having a breakdown voltage of 700 V for a similar gate-drain distance. Both devices have a 2 μm thick AlyGa1-yN (0.05<y<0.8) buffer. The breakdown voltage is defined as the voltage across drain to source $V_{DS}$ (gate under pinch-off) when $I_{DS}$ reaches a value of 1 mA/mm.

Due to the absence of an AlN/Si interface between source-to drain and gate-to-drain contacts, the temperature dependency on the breakdown voltage caused by Si substrate is eliminated and therefore devices can achieve higher OFF-state operating voltage at higher ambient temperature (reduced leakage current at higher voltage and at higher temperature). As the electrical conduction is only limited across the III-nitride epi-layer stack, the quality of the III-nitride epi-layer stack will determine the temperature dependency on the breakdown voltage.

Figure 5:
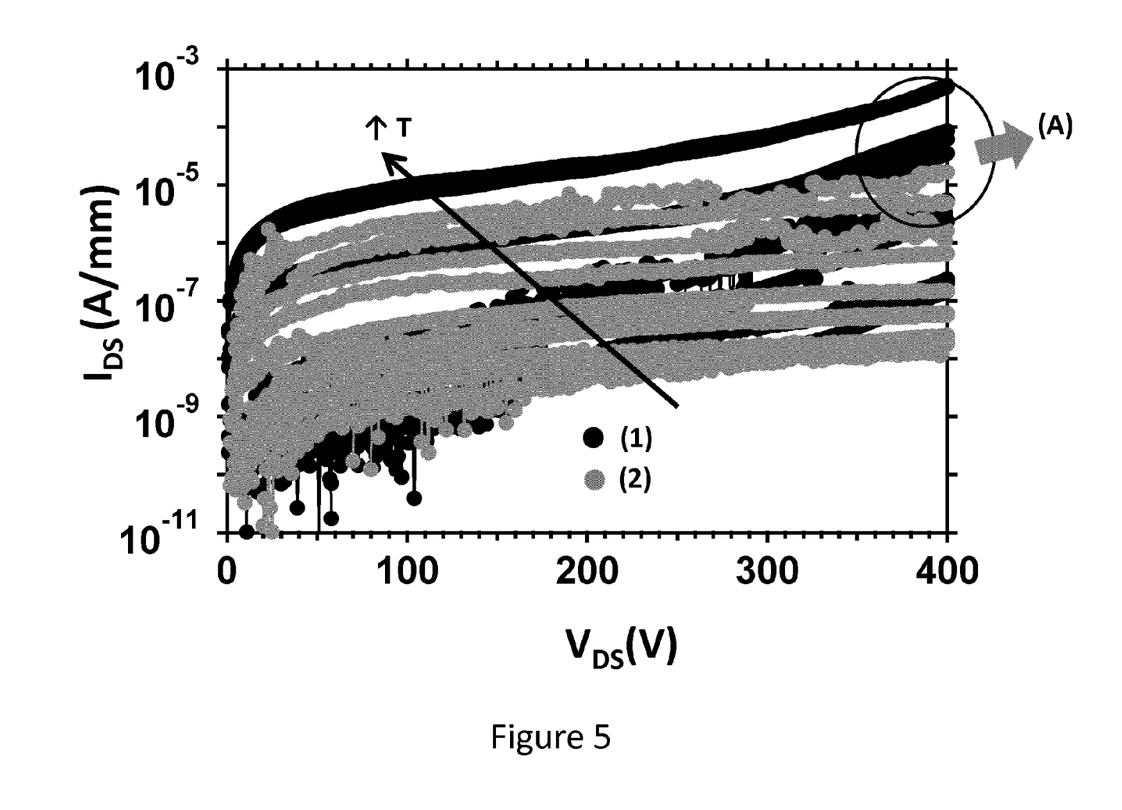
FIG. 5 shows the leakage characteristic curve (up to 400V) at various temperatures between 25° C. and 200° C. for a DHFET (1, black) and the device of the disclosure (2, light grey). Region "A" shows clearly a reduced leakage current in case of the device of the disclosure (2, light grey).

A comparative temperature assisted leakage characteristic curve (up to 400V for temperatures between 25° C. and 200° C.) on an OFF-state device (gate-drain distance of 20 μm) leakage is shown in the FIG. 5. The reduced leakage clearly illustrates that a high operating and breakdown voltage can be achieved at elevated ambient temperatures in case of the device of the disclosure (2, light grey) compared with the devices on full Si substrate (1, black).

Due to the narrow trench around the drain region, AlN/Si interface is interrupted and therefore there is no lateral conduction path limiting the breakdown voltage. Consequently, the breakdown voltage is independent of the $Al_yGa_{1-y}N$ (or GaN) buffer thickness and linearly depends on the gate-drain distance. This allows reducing the thickness of the III-nitride epi-layer (active layers stack) thereby reducing the manufacturing cost and the risk of wafer bow. Reducing the thickness of the III-nitride stack, minimize cracks or defects formation in the layers leading to high quality III-nitride-based high voltage/high power devices.

Moreover, reducing the thickness of the III-nitride epi-layer results in thin buffers which improve further heat dissipation as the gate-region (heat zone) is closer to the Si substrate. Consequently, for the thin buffers the trench width can be further reduced and therefore, in addition to enhanced heat dissipation, the overall mechanical stability can be strengthened.

When a (narrow) trench is formed around the drain region, a substantial part of the Si substrate remains underneath the device parts. Especially, the Si substrate underneath the gate region (heat zone) which is extending towards drain contact assists heat dissipation. Consequently devices with minimal ON-state device self-heating could be realized.

Figure 6:
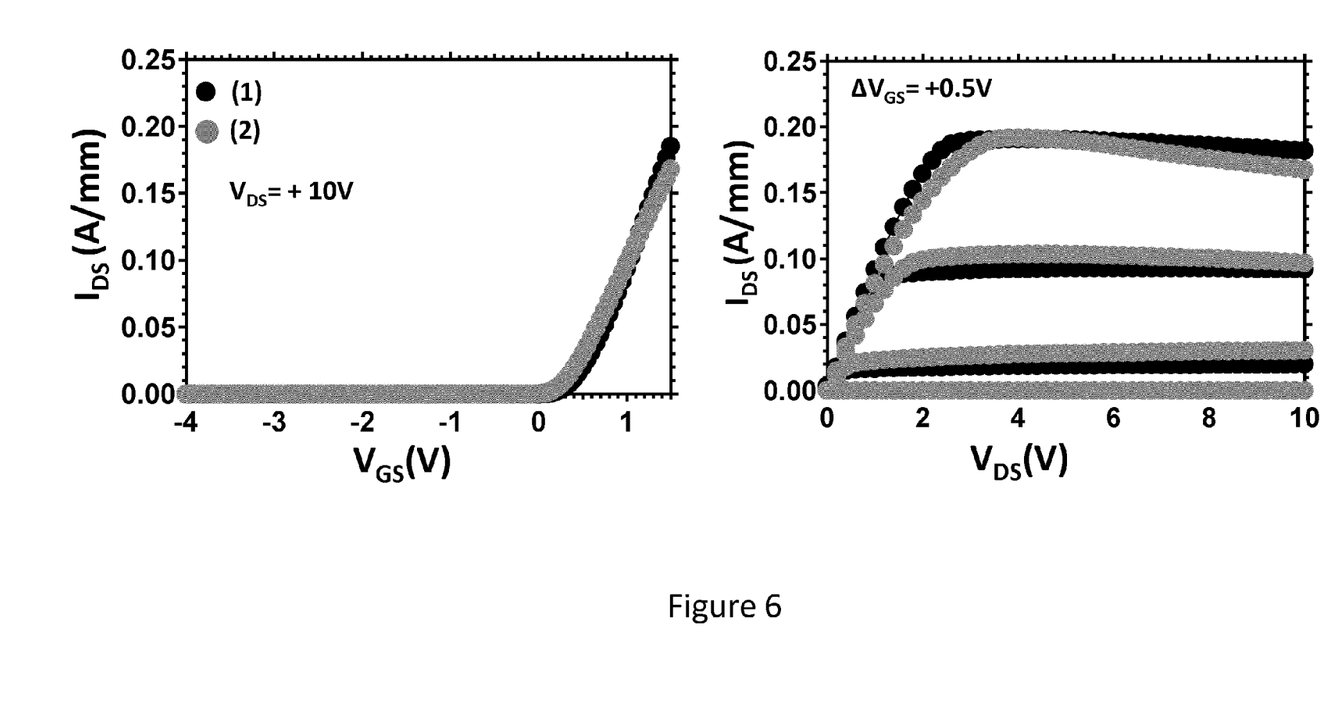
FIG. 6 shows typical transistor characteristics ($I_{DS}$-$V_{GS}$ and $I_{DS}$-$V_{DS}$) for a DHFET device before trench definition (1—black) and a device after trench definition (2—light grey).

In embodiments of the disclosure multiple trenches further allow to dissipate heat through the remaining Si substrate acting as a heat sink. FIG. 6 shows typical transistor characteristics ($I_{DS}$-$V_{GS}$ and $I_{DS}$-$V_{DS}$) for the device before (1, black) and after (2, light grey) the trench definition. After trench definition the device threshold voltage ($V_{TH}$), on-resistance ($R_{ON}$) and saturation current ($ID_{SAT}$) remain substantially unchanged when compared with the same parameters of the device without trench. These parameters suggest that the 2-DEG channel properties have been unchanged which means that the stress distribution over the entire channel layer after trench definition is very similar with the stress distribution in the channel layer without trench. In addition to the improved thermal performance, the remaining silicon substrate assures enhanced mechanical stability making the method suitable for robust manufacturing.

Figure 7:
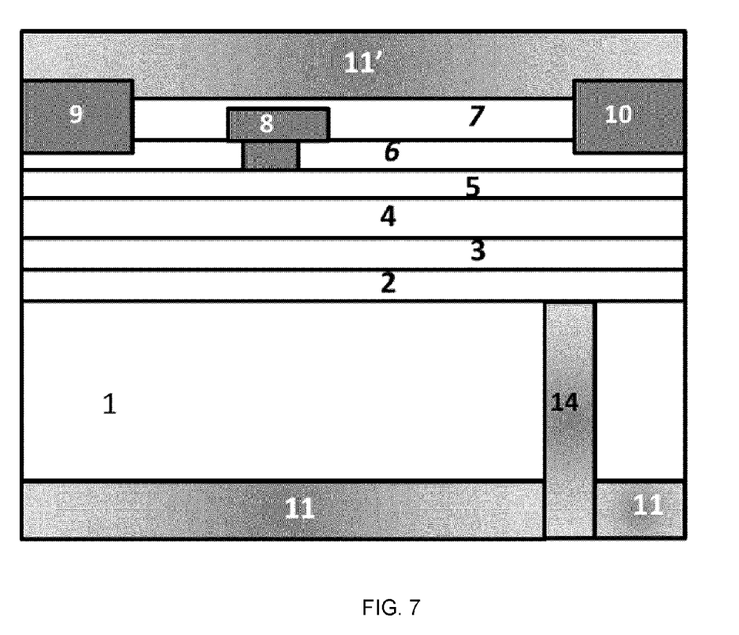
FIG. 7 represents schematically a device of the disclosure with the electrically insulating and thermally conductive layers (e.g. AlN) deposited on the backside 11 of the substrate and/or the front side 11' of the III-nitride device.

FIG. 7 represents schematically the electrically insulating and thermally conductive layers 11, 11' (e.g. AlN) deposited on the backside and/or the front side of the device to increase heat dissipation and mechanical stability.

Figure 8:
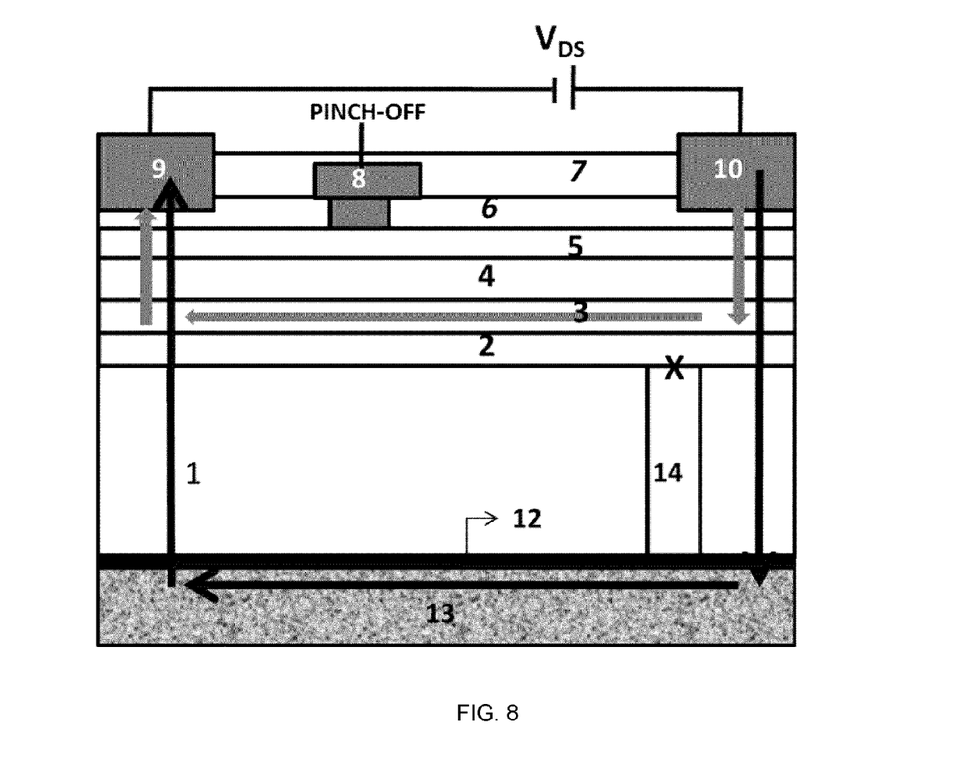
FIG. 8 represents schematically a device of the disclosure with floating metallic package (bonding layer 12, package 13) comprising the trench of the disclosure, but without the first (backside) protective layer. The mechanism of breakdown voltage reduction is illustrated by the arrows showing lateral conduction from drain towards the package.
Figure 9:
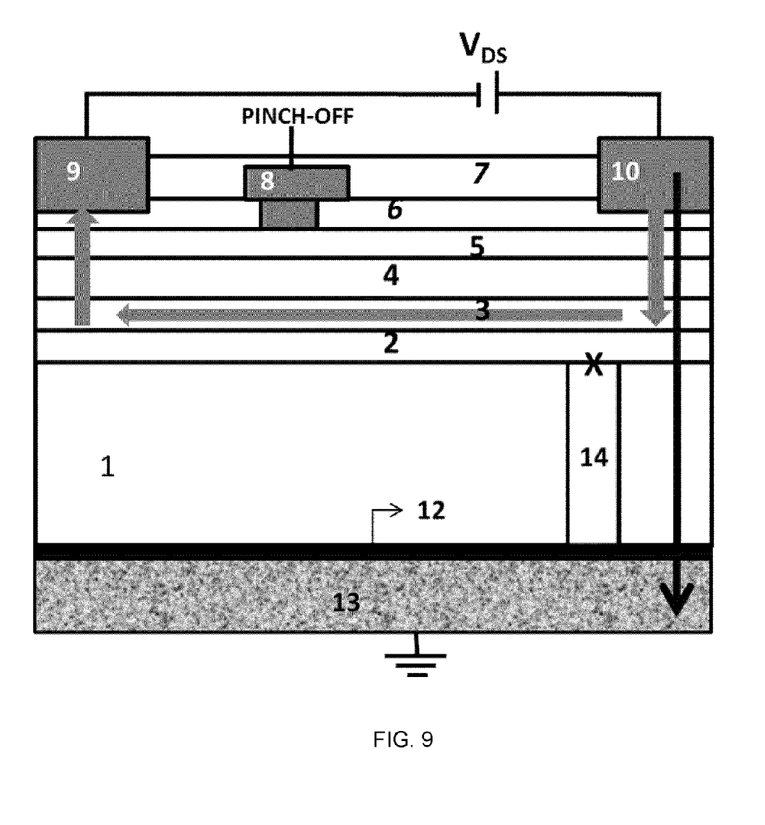
FIG. 9 represents schematically a device of the disclosure with grounded metallic package (bonding layer 12, package 13) comprising the trench of the disclosure, but without the first (backside) protective layer. The mechanism of breakdown voltage reduction is illustrated by the arrow showing vertical conduction from drain towards the package.
Figure 10:
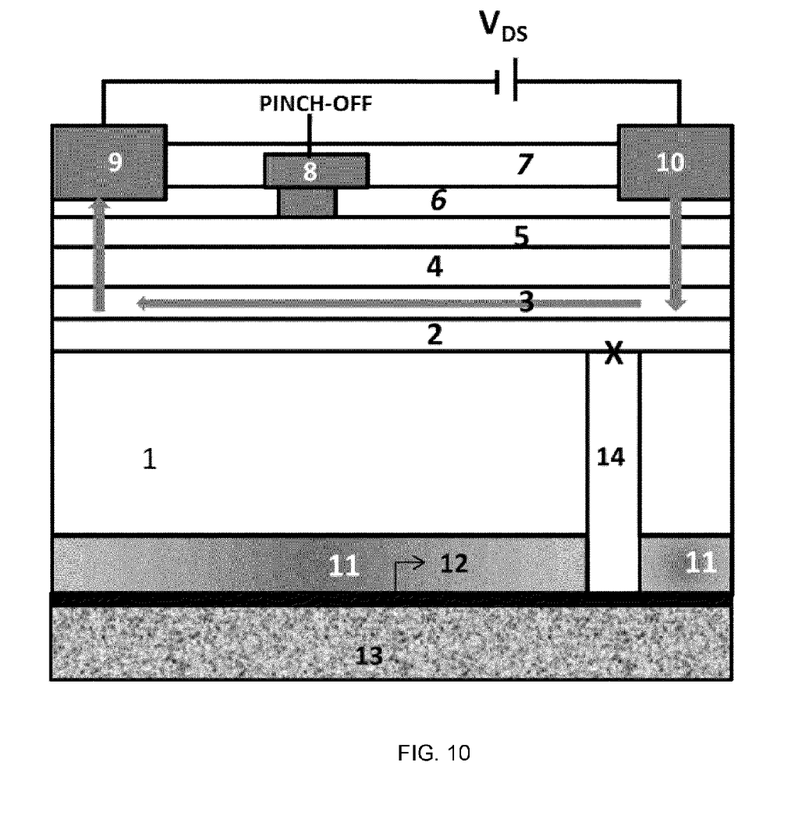
FIG. 10 represents schematically a device of the disclosure with a floating or grounded metallic package (bonding layer 12, package 13) comprising the trench of the disclosure and the first (backside) protective layer 11. There is no vertical/lateral conduction along the Si/package interface therefore the breakdown voltage is significantly enhanced.
Figure 11:
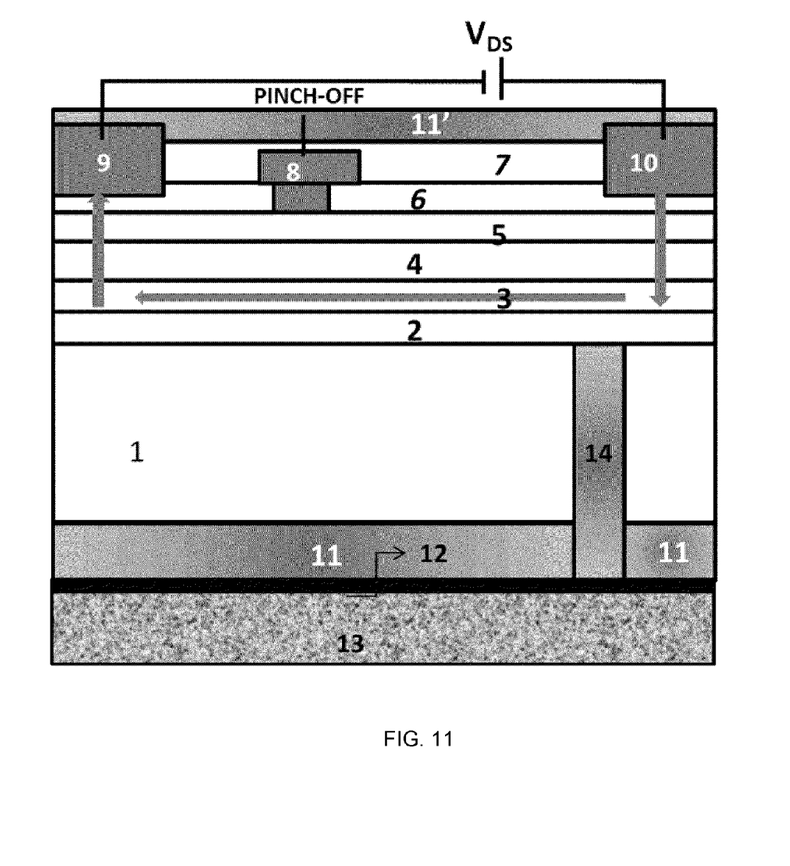
FIG. 11 represents the device of FIG. 10 additionally comprising a front side protective layer 11' made of e.g. AlN which functions as a heat spreading (heat dissipation) layer.
Figure 12:
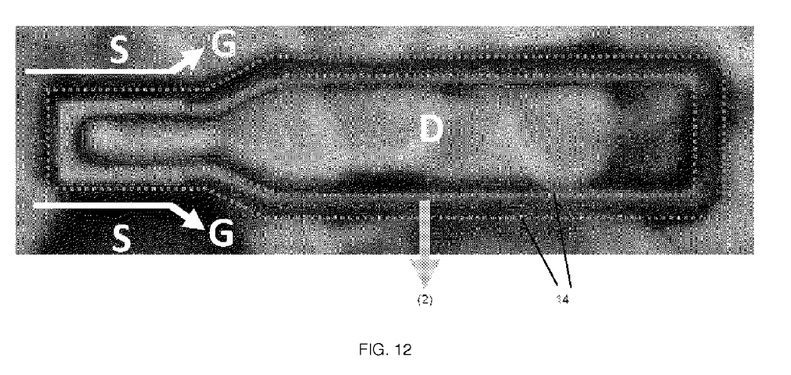
FIG. 12 shows an optical photograph from the backside of the device of the disclosure (2) of FIG. 4, wherein the dashed ring is inserted to visualize the trenched region 14 completely surrounding the drain region D. The solid white line is added to identify the gate region G underneath which Si is present, and S identifies the source region.

FIGS. 8 and 9 illustrate schematically devices having a narrow trench 14 surrounding the drain region which are bonded onto a metallic package 13 with a glue layer 12 (metallic). Above a certain voltage across drain-to-source there is a lateral or a vertical conduction across the package and, consequently, the breakdown voltage is lowered by a similar mechanism as in the case of AlN/Si interface. Lateral conduction starts when the package is floating, however vertical conduction starts when the package is grounded and in both the cases the breakdown voltage depends on the thickness of the III-nitride buffer layer. Therefore the benefit of an enhanced breakdown voltage due to the narrow trench is partially lost. Advantageously, this is solved by the use of an electrically insulating layer (reference number 11 in FIGS. 10 and 11) (e.g. AlN) as a backside protective layer (and hard mask) which suppresses the lateral/vertical conduction when the package is floating or grounded respectively. Consequently breakdown voltage enhancement can be achieved with a scheme as shown in FIG. 10 and FIG. 11.

Additionally, the electrically insulating layer is a good thermal conductor (e.g. AlN) which acts as a heat spreader layer towards the package. In particular the use of an AlN is compatible with any kind of package, i.e. either metallic or ceramic-based, in any configuration i.e. either floating or grounded.

What is claimed is:

1. A III-nitride device comprising:
 a) a substrate comprising a semiconductor material;
 b) a stack of active layers on top of and in contact with the substrate, each of the active layers comprising a III-nitride material, wherein a transition between the stack of active layers and the substrate is an active-layer-stack/substrate interface;
 c) a gate contact, a source contact and a drain contact on the stack of active layers, wherein a gate region, a source region and a drain region of the substrate are projections of respectively the gate contact, the source contact and the drain contact in the substrate; and
 d) a trench in the substrate extending from a backside of the substrate, the backside being opposite to a side of the substrate that is in contact with the stack of active layers, up to an underlayer of the stack of active layers, the trench completely surrounding the drain region, such that the drain region is electrically isolated from the gate region and the source region across the active-layer-stack/substrate interface, and being positioned in between an edge of the gate region towards the drain region and an edge of the drain region towards the gate region, and having a width such that the drain region of the substrate substantially comprises the semiconductor material, wherein the trench has a width greater than or equal to a thickness of the stack of active layers and smaller than or equal to a distance between the edge of the gate region towards the drain and the edge of the drain region.

2. The device of claim 1, wherein the trench is filled with an electrically insulating and thermally conductive material.

3. The device of claim 1, further comprising a first protective layer on the backside of the substrate, the first protective layer comprising an electrically insulating and thermally conductive material.

4. The device of claim 1, further comprising a second protective layer overlying and in contact with the source contact, the gate contact, and the drain contact, the second protective layer comprising an electrically insulating and thermally conductive material.

5. The device of claim 1, wherein the trench is filled with an electrically insulating and thermally conductive material selected from the group consisting of AlN, SiC, diamond, BN and combinations thereof.

6. The device of claim 1, wherein the trench is filled with an electrically insulating and thermally conductive material that is AlN.

7. The device of claim 1, wherein the substrate is a thinned silicon wafer.

8. The device of claim 1, wherein the trench has an aspect ratio between 10 and 500.

9. The device of claim 1, wherein the trench has an aspect ratio between 10 and 50.

10. The device of claim 1, wherein the trench has a width between 2 μm and 25 μm.

11. The device of claim 1, wherein the trench has a width between 2 μm and 10 μm.

12. The device of claim 1, wherein the trench has an aspect ratio between 10 and 50 and a width between 2 μm and 10 μm.

* * * * *